United States Patent
Berry et al.

(10) Patent No.: US 12,283,641 B2
(45) Date of Patent: Apr. 22, 2025

(54) PROTECTED INTERCONNECTS FOR LOW STRESS SOLAR CELL SHINGLING AND IMPROVED AESTHETICS

(71) Applicant: MAXEON SOLAR PTE. LTD., Singapore (SG)

(72) Inventors: Nicholas Eli Berry, Beaverton, OR (US); Mingchong Dai, Yantai (CN); Jianfang Si, Kunshan (CN); Zhaoji Li, Fremont, CA (US); Yu-Chou Shih, Union City, CA (US); Edwin Alexander Peraza Hernandez, San Jose, CA (US); Yafu Lin, San Jose, CA (US); Hongshuai Xu, Singapore (SG); Jialin Shen, Bozhou (CN)

(73) Assignee: MAXEON SOLAR PTE. LTD, Singapore (SG)

( * ) Notice: Subject to any disclaimer, the term of this patent is extended or adjusted under 35 U.S.C. 154(b) by 0 days.

(21) Appl. No.: 18/141,063

(22) Filed: Apr. 28, 2023

(65) Prior Publication Data

US 2024/0363782 A1  Oct. 31, 2024

(51) Int. Cl.
*H01L 31/05* (2014.01)
*H01L 31/048* (2014.01)
*H01L 31/18* (2006.01)

(52) U.S. Cl.
CPC ...... *H01L 31/0516* (2013.01); *H01L 31/0481* (2013.01); *H01L 31/188* (2013.01)

(58) Field of Classification Search
None
See application file for complete search history.

(56) References Cited

U.S. PATENT DOCUMENTS

| | | | | |
|---|---|---|---|---|
| 4,636,578 | A * | 1/1987 | Feinberg | B32B 17/10036 156/99 |
| 8,158,450 | B1 * | 4/2012 | Sheats | H01L 31/0516 438/57 |
| 2008/0314626 | A1 * | 12/2008 | Moore | H01L 31/0516 29/850 |
| 2018/0254738 | A1 | 9/2018 | Yang et al. | |
| 2019/0355859 | A1 * | 11/2019 | Zheng | H01L 31/0504 |
| 2022/0158585 | A1 * | 5/2022 | Padilla | H01L 31/02 |

FOREIGN PATENT DOCUMENTS

| | | |
|---|---|---|
| CN | 114744079 A | 7/2022 |
| CN | 115602761 A | 1/2023 |
| WO | WO-2012060086 A1 * 5/2012 | ............ C08F 210/16 |

OTHER PUBLICATIONS

English language machine translation of Fumito et al. (WO 2012/060086). (Year: 2024).*
From the EPO as the ISA, "Notification of Transmittal of the International Search Report and Written Opinion of the International Searching Authority, or the Declaration", PCT/SG2024/050274, Dec. 19, 2024, 19 pages.

* cited by examiner

*Primary Examiner* — Eli S Mekhlin
(74) *Attorney, Agent, or Firm* — Schmidt Patent Law, Inc.

(57) ABSTRACT

A string of shingled solar cells is disclosed. The string of shingled solar cells has flexible joints connecting the solar cells made from cured liquid polymeric adhesive. An electrically conductive interconnect passes through the flexible joint. The string of shingled solar cells also has interconnect reinforcements made from cured liquid polymeric adhesive to improve interconnect adhesion to the front surface of the solar cells.

15 Claims, 8 Drawing Sheets

PROTECTED INTERCONNECTS FOR LOW STRESS SOLAR CELL SHINGLING AND IMPROVED AESTHETICS

FIELD OF THE INVENTION

The invention relates generally to solar cell modules or panels and the solar cells within the solar cell modules.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to conductive regions on the solar cell to direct an electrical current from the cell to an external circuit. When solar cells are combined in an array such as a solar cell module, the electrical energy collected from all of the solar cells can be combined in series and parallel arrangements to provide power with a desired voltage and current.

SUMMARY

This specification discloses a solar module having a string of solar cells comprising at least a first and second substantially rectangular crystalline silicon solar cells arranged in a shingled manner. Each solar cell in the string has a front and a rear surface, where in normal operation the front surface solar cell faces the sunlight. The front and rear surfaces each have a metallization pattern. Connecting the first and second solar cells electrically in series is an electrically conductive interconnect. The interconnect is in contact with the rear surface metallization pattern of the first solar cell and in contact with the front surface metallization pattern of the second solar cell. The string of solar cells also has a flexible joint comprising a cured liquid polymeric adhesive. The flexible joint is in contact with the rear surface of the first solar cell, with the front surface of the second solar cell, and with the electrically conductive interconnect. The cured liquid polymeric adhesive from the flexible joint is electrically insulating and has a Shore A hardness of less than 80.

The front surface metallization pattern of the solar cells in the module includes a plurality of busbars oriented parallel to a short side of the solar cell. The electrically conductive interconnects are disposed on the busbars on the front surface of the solar cell. The interconnects may also be soldered to the busbars on the front surface of the solar cell.

The solar cells of the module may be arranged so that the long sides of the solar cells overlap in a shingled manner. Multiple flexible joints may connect one solar cell to an adjacent solar cell. The multiple flexible joints being positioned along the shingled edge of the solar cell.

The electrically conductive interconnect may comprise two portions. The two portions of the interconnect having differently shaped cross-sectional areas. One portion of the interconnect may have a flat rectangular cross-sectional area and a second portion of the interconnect may have a triangular or circular cross-sectional area. The triangular or circular cross-sectional portion may be disposed on the front surface of a solar cell. The flat rectangular cross-sectional area may be disposed on the rear surface of the solar cell. The interconnect may be arranged so that the flexible joint embeds or encloses the portion of the interconnect that transitions between the two differently shaped cross-section areas. The area of the interconnect embedded by the flexible joint may have a flat rectangular cross-sectional area whereas other portions of the interconnect have a circular cross-sectional area.

The solar cells of the module may also have interconnect reinforcements comprising a cured liquid polymeric adhesive. This cured liquid polymeric adhesive is electrically insulating. The interconnect reinforcement bonds the electrically conductive interconnect to the front surface of the solar cell. The interconnect reinforcement is positioned toward the interior of the front surface of the solar cell so that the interconnect reinforcement is not covered by any adjacent solar cell.

The cured liquid polymeric adhesive of the interconnect reinforcement may be transparent. The cured liquid polymeric adhesive of the interconnect reinforcement may contain infrared reflective pigment or infrared transparent pigment. In some cases, the same adhesive may be used for forming the flexible joints and for forming the interconnect reinforcements.

A method for assembling string of solar cells with flexible joints includes: dispensing a liquid polymeric adhesive onto a front surface of a first solar cell; placing an electrically conductive interconnect on the front surface of the solar cell and into the liquid polymeric adhesive; soldering the electrically conductive interconnect to a busbar on the front surface of the first solar cell; attaching a second solar cell to the first solar cell so that the first and second solar cells are arranged in a shingled manner and the liquid polymeric adhesive and electrically conductive interconnect are both in contact with a rear surface of the second solar cell; and curing the liquid polymeric adhesive.

This specification further discloses a method for assembling a string of solar cells with flexible joints and reinforcement interconnects includes: dispensing a first and second areas of liquid polymeric adhesive onto a front surface of a first solar cell; placing an electrically conductive interconnect on the front surface of the solar cell and into the first and second areas of liquid polymeric adhesive; soldering the electrically conductive interconnect to a busbar on the front surface of the first solar cell; attaching a second solar cell to the first solar cell so that the first and second solar cells are arranged in a shingled manner and the first area of liquid polymeric adhesive and electrically conductive interconnect are both in contact with a rear surface of the second solar cell; and curing the liquid polymeric adhesive.

BRIEF DESCRIPTION OF THE DRAWINGS

The figures described below depict various aspects of the system and methods disclosed herein. Each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners or may have non-linear edges. The term "identical" is intended to mean "identical or substantially identical" and to encompass minor deviations in shape, dimensions, structure, composition, or configuration, for example.

Figure 1:
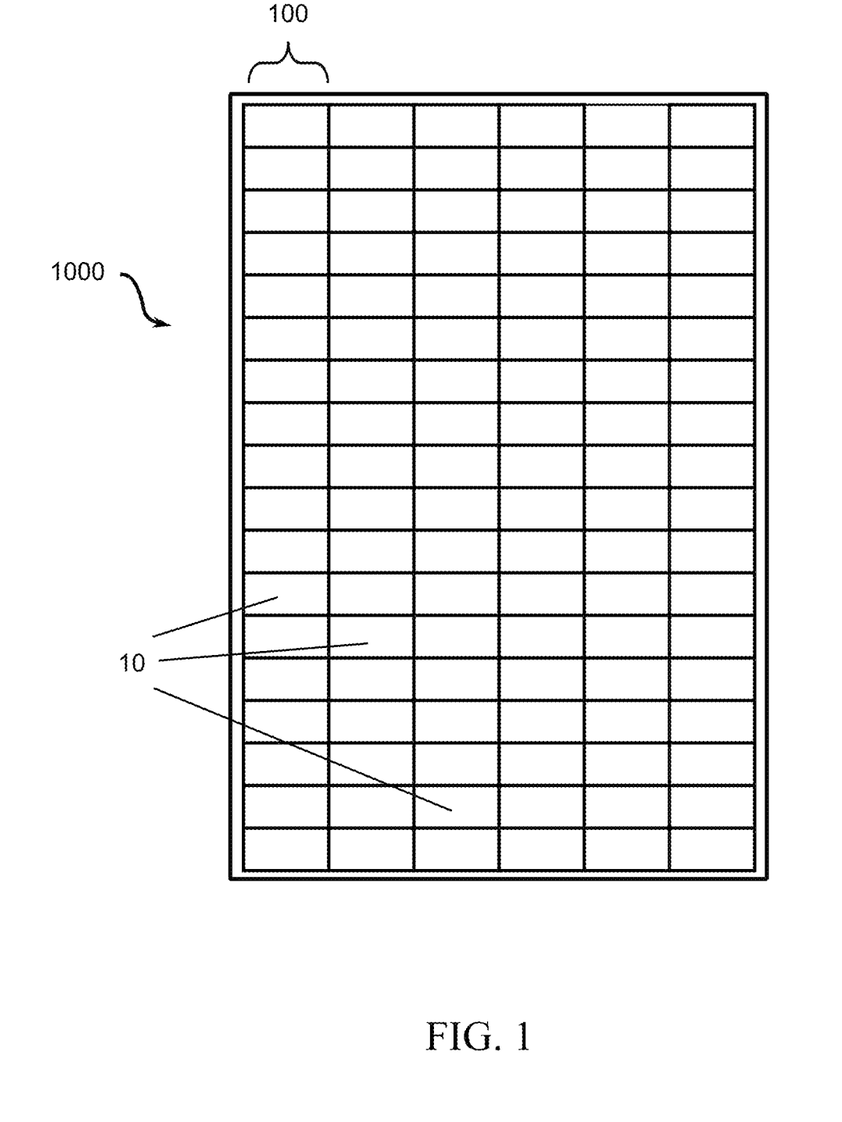
FIG. 1 schematically illustrates a solar module.

This specification discloses high-efficiency solar modules (also referred to herein as solar panels). FIG. 1 shows a solar module 1000 containing six super cells 100 arranged in parallel rows and electrically connected in parallel. Each super cell 100 in FIG. 1 contains several individual solar cells 10 arranged in a row and electrically connected in series. A solar module may comprise any suitable number of super cells and super cells may comprise any suitable number of solar cells. For example, a solar module may have 480 solar cells arranged in 6 super cells with each super cell containing 80 individual solar cells. The super cells may have lengths spanning essentially the full length or width of the solar module or two or more super cells may be arranged end-to-end in a row.

In the examples described in this specification, each solar cell 10 is a crystalline silicon solar cell having front (sunny side) surface and rear (shaded side). Between the front surface and rear surface are at least one semiconductor layer of p-type conductivity and at least one semiconductor layer of n-type conductivity. The n-type semiconductor layer and the p-type semiconductor layer meet to form an n-p junction. Each solar cell has electrical contacts or metallization pattern on the front surface of the solar cell which makes electrical contact with a semiconductor layer on one side of the n-p junction. Further, each solar cell has electrical contacts on the rear surface of the solar cell which makes electrical contact with a semiconductor layer on the opposite side of the n-p junction. For example, if the front surface electrical contact (metallization pattern) makes an electrical connection with the n-type semiconductor layer, then the rear surface electrical contact makes an electrical contact with the p-type semiconductor layer. However, other material systems, diode structures, physical dimensions, or electrical contact arrangements may be used if suitable.

Resistive effects in solar cells may reduce the efficiency of the solar cell by dissipating power in the resistances. Series resistance in a solar cell may be due to movement of the current through the p-n materials of the solar cell; contact resistance between the metal contact and the silicon; and resistance in the metal contacts or metallization. The design of the metallization (e.g. the metallization pattern) of a solar cell may reduce losses due to resistance. Certain features of the metallization pattern such as finger and busbar spacing may be optimized to reduce resistance of the metallization.

Figure 2:
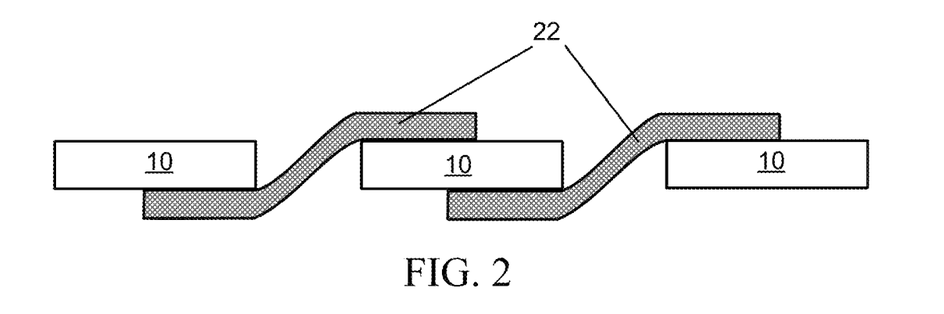
FIG. 2 schematically illustrates a cross-sectional view of a string of solar cells.

Solar cells 10 in a super cell are electrically connected in series. This generally requires an electrical connection from the front surface of one solar cell to the rear surface of an adjacent solar cell. In traditional ribbon-connected solar cells, electrically conductive ribbons are used to connect the back metal contact of a solar cell with the front metal contact of an adjacent solar cell. This type of connection requires a gap between solar cells to accommodate ribbons used for connecting adjacent solar cells. FIG. 2 shows a cross-sectional view of a string of solar cells 10 connected in series by ribbons 22. For solar cells 10 having electrical contacts at the front and rear surfaces of the solar cell, the ribbon must connect the front surface of one solar cell with the rear surface of an adjacent cell to make a series connection. For solar cells in FIG. 2, this series connection requires that the solar cells be spaced apart to allow ribbon 22 to make the required connection. The presence of a space between solar cells reduces the area in a solar module that can be used to generate electrical power.

Figure 3A:
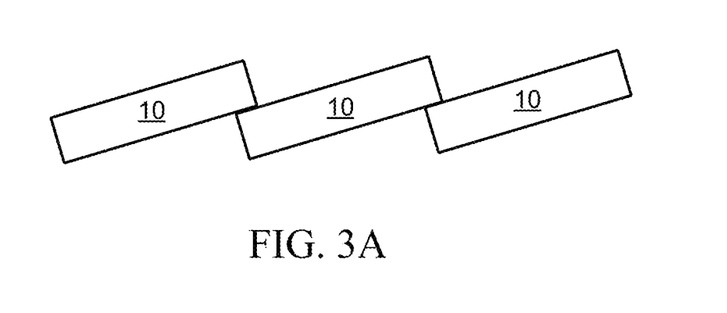
FIGS. 3A and 3B schematically illustrate cross-sectional views of a string of shingled solar cells.
Figure 3B:
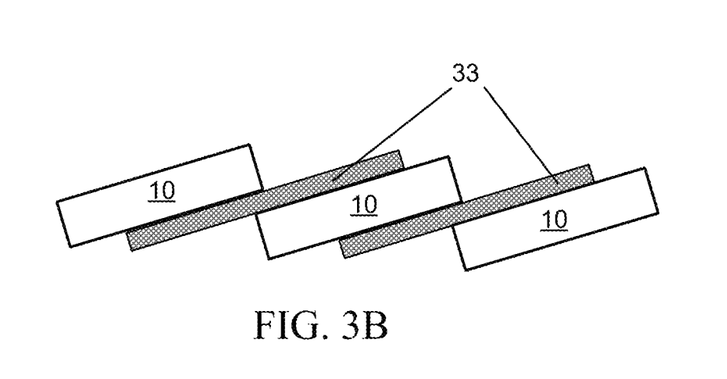

Shingling solar cells can eliminate gaps between solar cells as shown in FIGS. 3A & 3B. Shingled solar cells 10 can be electrically connected in series by using electrically conductive adhesive to bond the solar cells together as in FIG. 3A (electrically conductive adhesive not shown). Or shingled solar cells 10 can be electrically connected in series by interconnects 33 as shown in FIG. 3B. Because the interconnect is sandwiched between solar cells 10, e.g. in the region where the solar cells overlap, the interconnect may experience stress great enough to damage the solar cells, to damage the interconnect, or to degrade the efficiency of the interconnection, e.g. the stress may alter the connection between the interconnect and the solar cell in an non-optimal manner.

This specification discloses high-efficiency solar modules where the interconnects between solar cells are protected by a soft adhesive thereby reducing the stress that the interconnect may experience.

Figure 4:
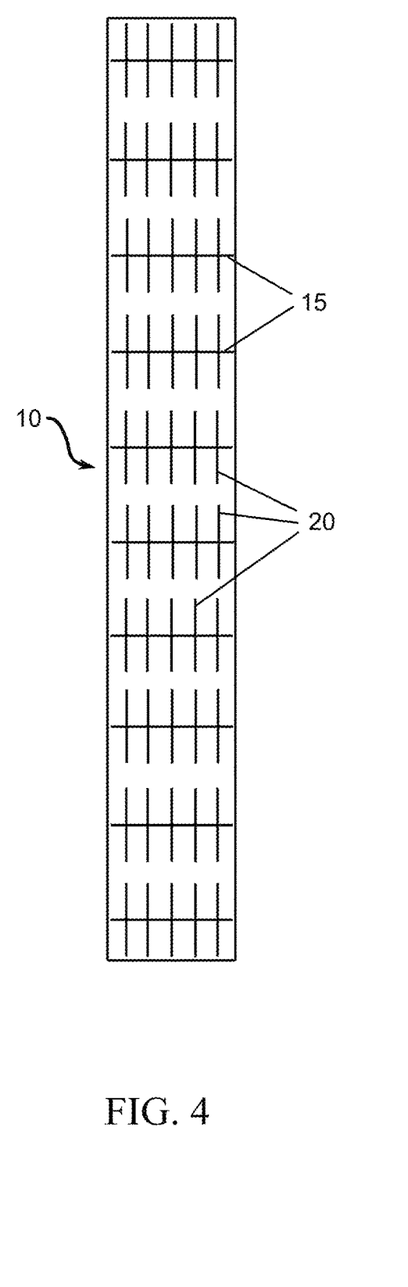
FIG. 4 schematically illustrates a plan view of the front surface of a solar cell.

FIG. 4 shows a schematic diagram of a plan (front surface) view of solar cell 10. Solar cell 10 is rectangular or substantially rectangular shaped solar cell having a pair of long sides and a pair of short sides. The front surface of solar cell 10 has an electrically conducting front surface metallization pattern that collects current generated by the solar cell when the solar cell is illuminated by light. The metallization serves as an electrical contact for the solar cell and may comprise silver. The front surface metallization pattern includes multiple busbars 15 running parallel to the short sides of solar cell 10 and running for substantially the length of the short sides of the solar cell. The front surface metallization also includes multiple fingers 20 attached substantially perpendicularly to busbars 15 and running parallel to each other. The rear surface of solar cell 10 (not shown) may have a similar metallization pattern as the front surface.

Figure 5:
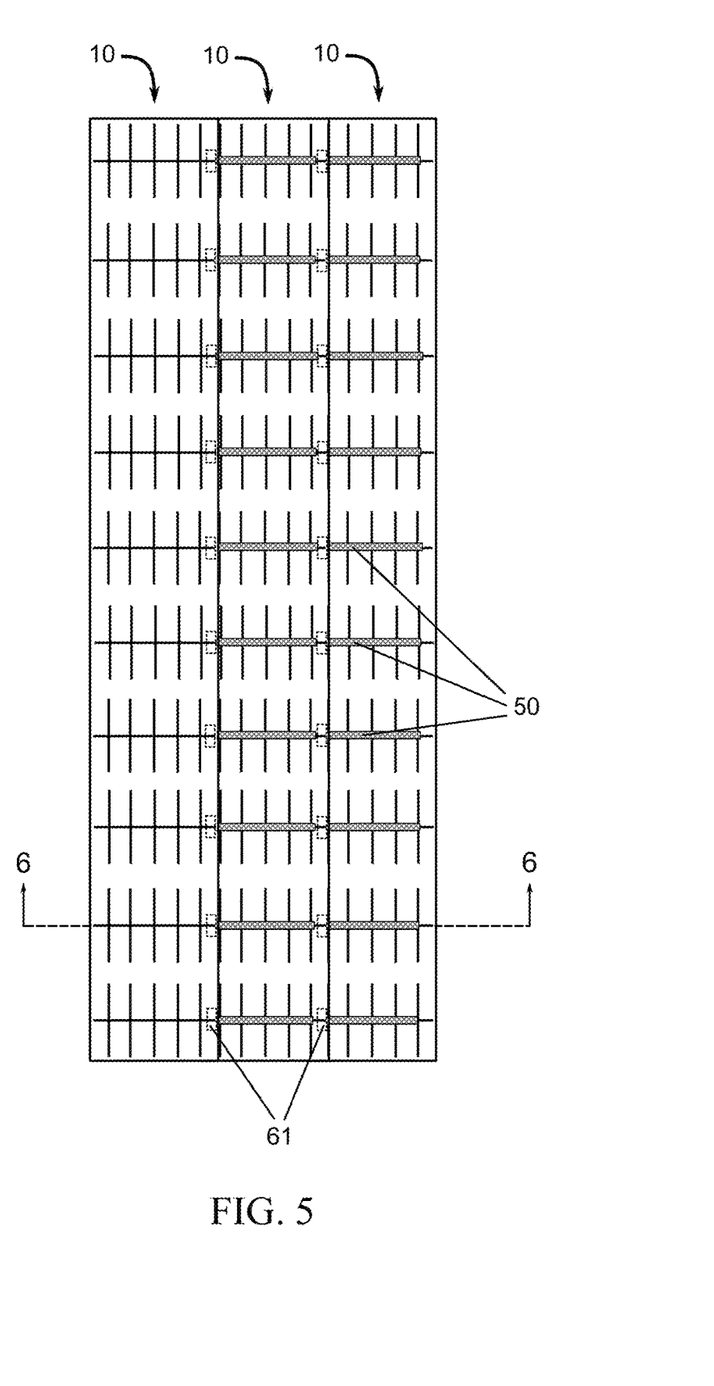
FIG. 5 schematically illustrates a plan view of a string of solar cells.

FIG. 5 shows a schematic diagram of a plan (front surface) view of string of series-connected solar cells 10 arranged in a shingled manner. This string of solar cells may form a portion of super cell 100. The solar cells are arranged so that a long side of a solar cell overlaps with the front surface of an adjacent solar cell. Solar cells 10 are electrically connected in series to each other using electrically conductive interconnects 50 to connect the front surface metallization of one solar cell to the rear surface metallization (not shown) of an adjacent solar cell. In certain embodiments, the rear surface metallization may include one or more solder pads. These solder pads in the metallization facilitate greater ease of alignment of the interconnect to the rear surface metallization. Once the interconnect is aligned with the solder pad(s), the interconnect may be soldered to the solder pad(s). Without solder pads in the rear surface metallization, the interconnect must be aligned with and soldered to a busbar on the rear surface which is more difficult due to the thinness of the busbar.

In FIG. 5, ten interconnects 50 electrically connect in series the middle solar cell to the left solar cell and ten interconnects 50 electrically connect in series the right solar cell to the middle solar cell. Although FIG. 5 illustrates the use of ten interconnects, a different number of interconnects may be used to connect the solar cells. FIG. 5 shows interconnect 50 is disposed over and in contact with busbar 15 of the front surface metallization. Interconnect 50 may be attached, in part, to busbar 15 by soldering. Interconnect 50 may be made from a conductive metal, for example, copper. Interconnect 50 may also have a conductive metal core, e.g. of copper, coated in silver, lead, tin, lead-tin, or tin-bismuth. The coating may be done by electroplating.

In certain embodiments, busbars 15 are not included in the front surface metallization thereby saving cost on metallization. Thus, the front surface metallization includes fingers 20 but not busbar 15. When interconnect 50 is attached to the front surface of the solar cell, the interconnect may be soldered directly onto fingers 20 of the front surface metallization.

Figure 6:
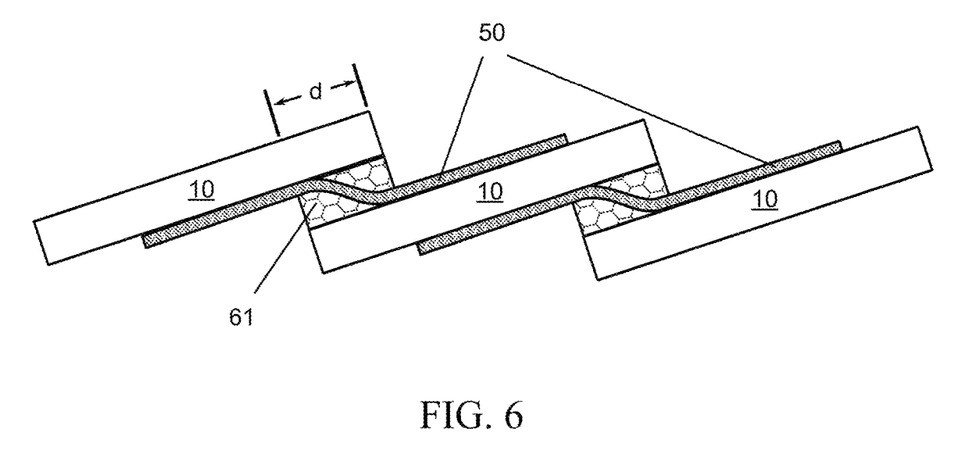
FIG. 6 schematically illustrates a cross-sectional view of the string of solar cells in FIG. 5 viewed from line 6-6.

FIG. 6 shows a cross-sectional view of the string of solar cells 10 through line 6-6 in FIG. 5. FIG. 6 shows interconnects 50 electrically connecting the front surface of a solar cell to the rear surface of an adjacent solar cell thereby connecting the solar cells electrically in series. Between adjacent solar cells in the region where one solar cell overlaps with an adjacent solar cell, e.g. the area spanned by distance "d," is a flexible joint 61. Flexible joint 61 is contact with both the rear surface of one solar cell and the front surface of an adjacent solar cell. Flexible joint 61 also surrounds interconnect 50 at the solar cell overlap region. Thus, interconnect 50 is embedded in flexible joint 61.

Flexible joint 61 may be made from a soft insulating adhesive that protects interconnect 50, solar cells 10, and the edges of solar cells 10 in the overlap region. The soft adhesive material of flexible joint 61 reduces stress in the solar cell overlap region which reduces the likelihood of solar cell cracking during solar module manufacturing, e.g. during the lamination step. Flexible joint 61 also reduces solar cell damage due to thermal cycling of the solar module and improves the overall mechanical performance of the solar cell module. Because flexible joint 61 is non-conductive (insulating) and surrounds and electrically isolates interconnect 50, flexible joint 61 prevents contact between the interconnect and the p-n junction at the edge of the solar cell which reduces the risk of shunting of the solar cell during lamination or when the solar module is under mechanical load or due to thermal cycling of the solar module.

Figure 8:
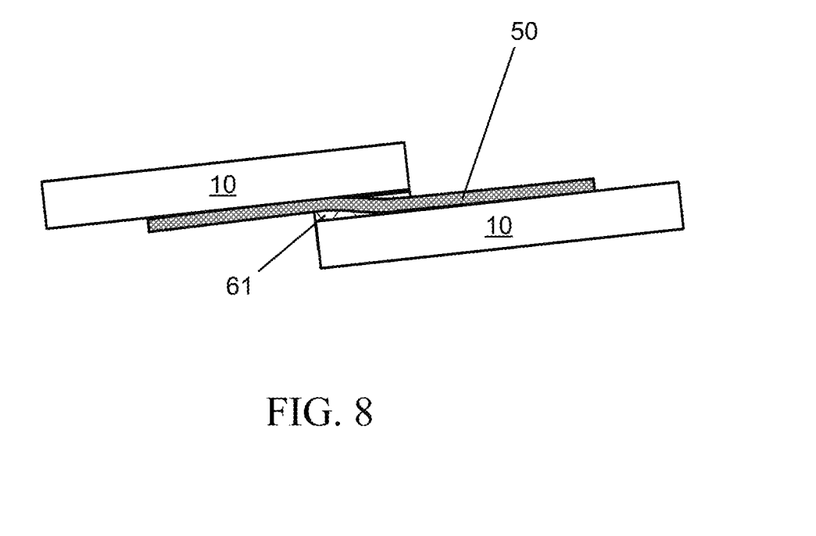
FIG. 8 schematically illustrates a cross-sectional view of a string of solar cells under compression.
Figure 9:
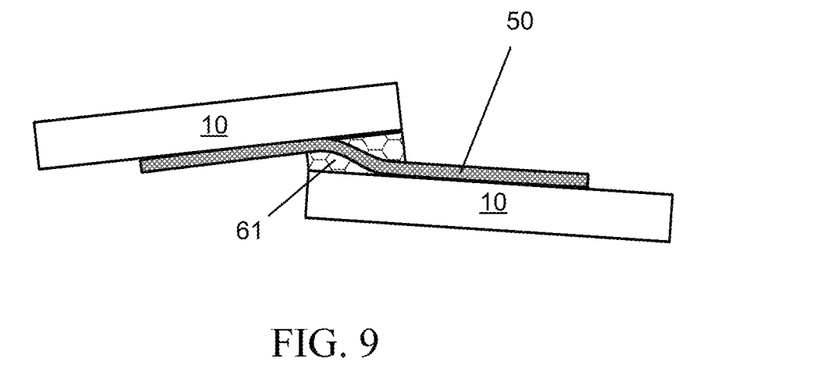
FIG. 9 schematically illustrates a cross-sectional view of a string of solar cells subject to bowing.

Flexible joint 61 may improve solar module performance by supporting the overlap region during compression of the solar cells in the module. FIG. 8 is a cross-sectional view of two shingled solar cells with a flexible joint under a compression load. Flexible joint 61 resists compressive forces and protects interconnect 50 from damage. Without flexible joint 61, interconnect 50 would be compressed between the solar cells potentially resulting in damage to the interconnect. Flexible joint 61 also protects interconnect 50 when the solar cells undergo bowing as shown in FIG. 9. The flexible joint resists the forces that cause bowing in the solar cell string. In addition, without the flexible joint, the left edge of right solar cell in FIG. 9 may impact interconnect 50 potentially damaging the interconnect. Flexible joint 61 also supports the overlap region of the solar cells by providing stress relief during vibration and a coefficient of thermal expansion mismatch during temperature cycling.

Figure 7:
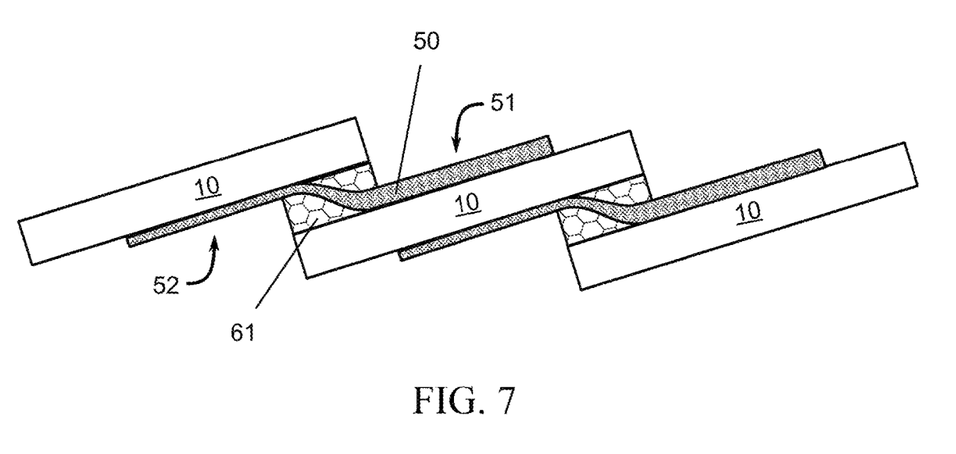
FIG. 7 schematically illustrates a cross-sectional view of a string of solar cells.

Flexible joint 61 is compatible with many different types of interconnect cross sectional geometries. Interconnects may have a uniform cross-sectional area throughout the length of the interconnect. For example, the interconnects shown in FIG. 6 may have a circular cross-sectional area or rectangular cross-sectional area throughout the length of the interconnect. Interconnects may also have different cross-sectional shapes in different regions of the interconnect. FIG. 7 illustrates interconnects that have two different cross-sectional areas. Interconnect 50 may have a triangular or circular cross-sectional area in region 51 where the interconnect is disposed on the front surface of a solar cell and a flat rectangular cross-sectional area in region 52 where the interconnect is disposed on the rear surface of a solar cell. The triangular or circular cross-sectional area may be advantageously configured to shade a minimal amount of the front surface of the solar cell. Whereas the flat rectangular cross-sectional area provides for better electrical contact with the solar cell. Flexible joint 61 surrounds and embeds the area where the interconnect transitions from triangular to flat. This transition area may be more fragile than other areas of the interconnect and flexible interconnect 61 advantageously protects this more fragile transition area.

In certain embodiments, interconnect 50 may have a circular cross-sectional area in both regions 51 and 52, but has a flat rectangular cross-sectional area in the area where flexible joint 61 surrounds and embeds the interconnect. This flat rectangular cross-sectional area of the interconnect may advantageously give the interconnect more flexibility at the flexible joint area.

The overlap distance "d" (shown in FIG. 6) between two solar cells may be between 0 and 2 mm. Flexible joint 61 may be located completely within the overlap distance. Flexible joint 61 may also only partially cover the overlap distance. While FIG. 5 depicts flexible joint as having a rectangular shape in plan view, flexible joint 61 may also have other shapes such as circular, triangular, elliptical, etc. FIG. 5 shows discrete flexible joints 61 positioned along the long side of the solar cell at the location where busbar 15 meets the long side of the cell. Flexible joints may also be present at other locations along the long side of the cell, e.g. between the busbars. In other instances, the flexible joint forms a continuous line connecting multiple busbars along the long side of the cell.

Flexible joint 61 is made from a liquid polymeric adhesive material. In liquid form, the adhesive preferably has a viscosity (@ 1 rpm) between 5 k and 250 k centipoise (cP) and preferably has greater than 6 hours of working life for ease of stencil printing. The cured liquid polymeric adhesive has a Shore A Hardness of less than 80. Shore A hardness of the cured adhesive may be measured with a Shore durometer. The cured adhesive is preferably stable against UV degradation, temperature cycling, and damp heat. The cured adhesive should be electrically insulating and preferably does not outgas and has no chemical reactivity. Possible liquid polymer adhesives that may be used include silicone adhesive, ethylene vinyl acetate, polyolefin adhesive, epoxy, and acrylic adhesive.

Figures 10, 11:
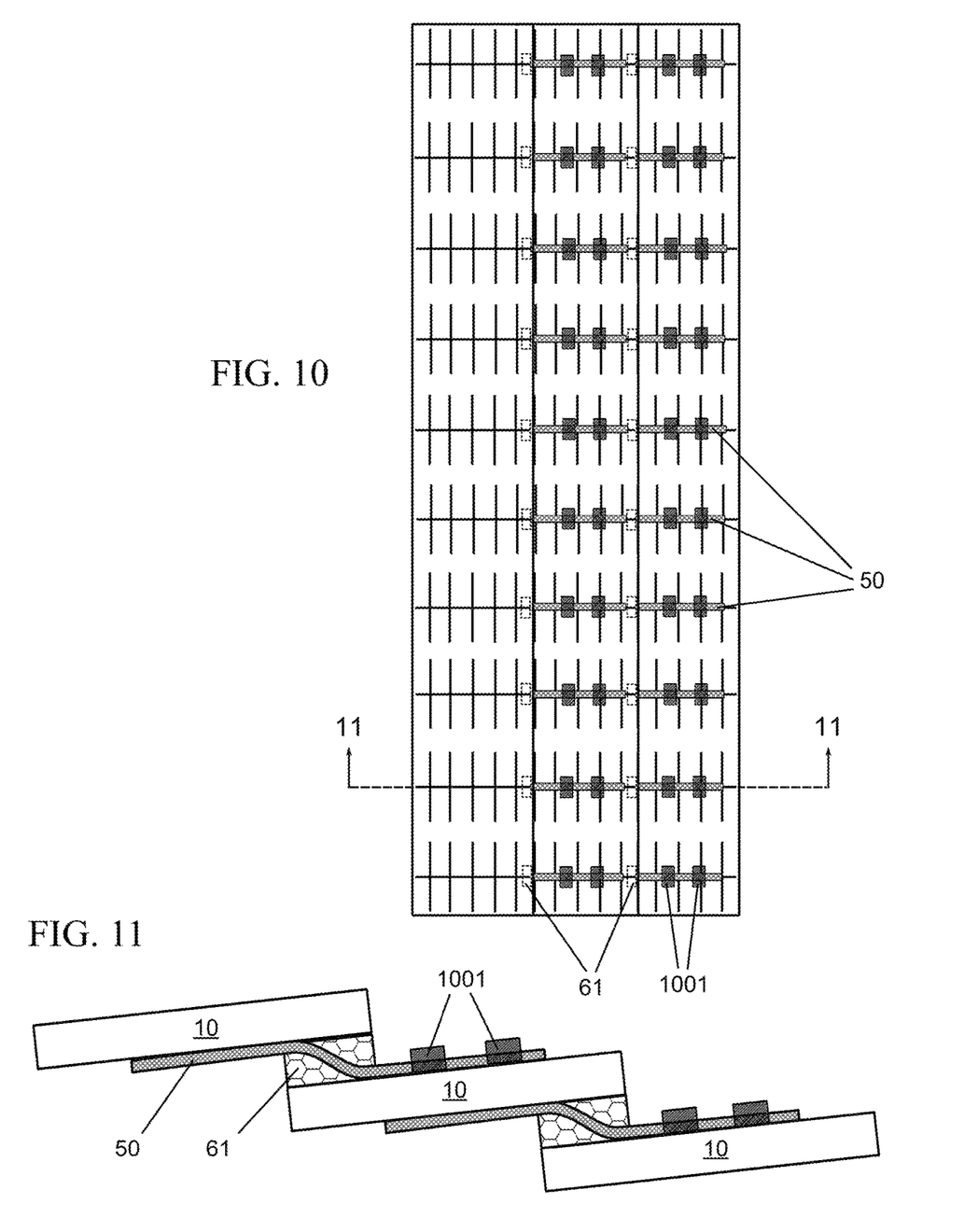
FIG. 10 schematically illustrates a plan view of a string of solar cells.
FIG. 11 schematically illustrates a cross-sectional view of the string of solar cells in FIG. 10 viewed from line 11-11.

In addition to using adhesives in a flexible joint, adhesive may also be used to bond the interconnect to the front surface of the solar cell. FIG. 10 shows a schematic diagram of a plan (front surface) view of string of series-connected solar cells arranged in a shingled manner. The solar cells are arranged so that a long side of a solar cell overlaps with the front surface of an adjacent solar cell. The solar cells are electrically connected in series to each other using electrically conductive interconnects 50 to connect the front surface metallization of one solar cell to the rear surface metallization of an adjacent solar cell. Between adjacent solar cells in the region where one solar cell overlaps with an adjacent solar cell is a flexible joint 61. Interconnect 50 is bonded to the front surface of a solar cell with interconnect reinforcements 1001. Interconnect reinforcements 1001 are positioned towards the interior of the front surface of the solar cell, i.e. not at the edge of the solar cell where the flexible joint would be positioned. With this positioning interconnect reinforcements 1001 are not covered by any adjacent solar cells and in normal operation are exposed to light and are visible. Since the interconnect reinforcements are exposed to light and are visible, the optical properties of interconnect reinforcements may be important for solar cell performance and aesthetics. While FIG. 10 illustrates using of both flexible joints 61 and interconnect reinforcements 1001 on the same string of solar cells, interconnect reinforcements 1001 can be used independently of the flexible joints.

When using interconnect reinforcements 1001 to bond interconnect 50 to the solar cell, busbar pads are no longer needed. Traditionally, busbar pads are areas of metallization that function as places where more solder can be applied to improve adhesion of the interconnect to the surface of the solar cell. Using interconnect reinforcements 1001 eliminates the need for additional solder and eliminates the need for busbar pads which reduces silver usage and lowers costs. Further, the use of interconnect reinforcements 1001 bonds the interconnect to the solar cell better than traditional solder thereby reducing the risk of the interconnect debonding during lamination and temperature cycling. The elimination of busbar pads also increases the active area of the solar cell and improves the aesthetics of the solar cell.

FIG. 11 shows a cross-sectional view of the string of solar cells through line 11-11 in FIG. 10. Interconnect reinforcement 1001 contacts both interconnect 50 and the front surface of the solar cell to bond interconnect 50 to the surface of the solar cell. Interconnect reinforcements 1001 may be placed at discrete points along the length of the portion of interconnect 50 disposed on the front surface of the solar cell. Interconnect reinforcements 1001 may cover the top of interconnect 50 as shown in FIGS. 10 and 11. In some instances, interconnect reinforcement 1001 may be one continuous strip covering substantially the entire portion of interconnect 50 disposed on the front surface of the solar cell.

Similar to the flexible joint, interconnect reinforcement 1001 comprises a liquid polymeric adhesive material. In liquid form, the adhesive preferably has a viscosity (@ 1 rpm) between 5 k and 250 k centipoise (cP) and preferably has greater than 6 hours of working life for ease of stencil printing. The cured liquid polymeric adhesive is transparent with a refractive index ranging from 1.39 to 1.5 at 632 nm. The cured adhesive has a tensile adhesion strength that is 1 to 10 times the standard interconnect to busbar pad adhesion strength, providing for a more secure attachment of the interconnect to the solar cell. Tensile adhesion strength of an adhesive may be measured using the ASTM D897 standard. Measured using the ASTM D897 standard, the adhesive material of interconnect reinforcement has a tensile adhesion strength ranging from 0.1 MPa to 20 MPa. The cured adhesive is preferably stable against UV degradation, temperature cycling, and damp heat. The cured adhesive should be electrically insulating. The cured adhesive preferably does not outgas and has no chemical reactivity. Alternatively, interconnect reinforcement 1001 may not be fully transparent but instead may contain pigments or structures that reduce the specular reflection of the interconnect. Reducing the specular reflection of the interconnect improves the aesthetics of the solar module. Preferably, even though interconnect reinforcement 1001 reduces specular reflection, it is still transparent or reflective to infrared light. Possible liquid polymer adhesives that may be used include silicone adhesive, ethylene vinyl acetate, polyolefin adhesive, epoxy, and acrylic adhesive. The liquid polymer adhesive may contain infrared reflective pigments (e.g. PBr29-Pigment Brown 29) or infrared transparent pigments (e.g. Perylene Pigment Black 32).

In some cases, the same liquid adhesive material can be used for the flexible joint as well as for the interconnect reinforcement. An adhesive having a Shore A hardness of less than 80, when cured, and the necessary adhesive strength and optical properties to serve as an interconnect reinforcement could be used for both flexible joint and interconnect reinforcement. For example, a transparent silicone adhesive which has a cured Shore A hardness of less than 80 and the appropriate adhesive strength can be used in both flexible joint 61 and interconnect reinforcement 1001.

Figure 12:
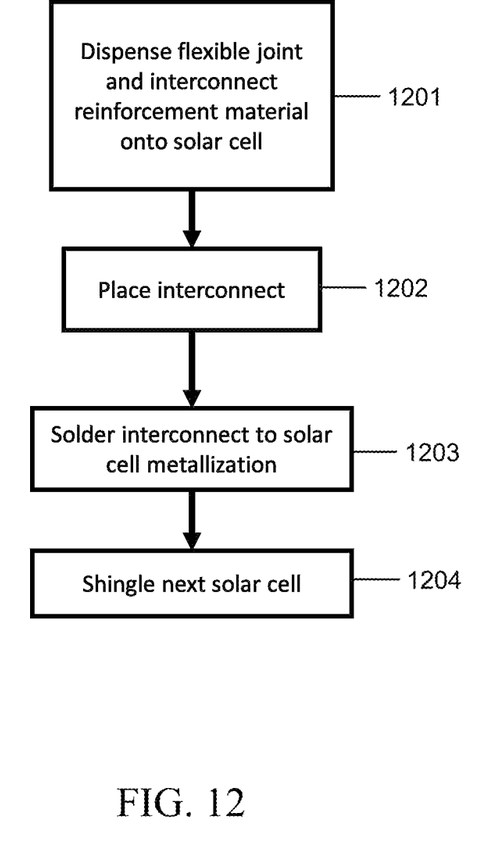
FIGS. 12, 13, 14, and 15 are flow charts of steps for assembling a string of solar cells.

FIG. 12 is a flow chart showing steps for assembling a string of shingled solar cells with flexible joints and interconnect reinforcements. In step 1201, liquid adhesive is dispensed or printed onto the front surface and at the edge of the solar cell. This area of liquid adhesive will eventually become the flexible joint. Liquid adhesive is also dispensed or printed onto the front surface at points along where the interconnect is to be placed. These areas of liquid adhesive will eventually become interconnect reinforcements. Optionally, after step 1201, the areas of liquid adhesive may be partially cured. In step 1202, the interconnect is placed into the areas of liquid adhesive dispensed in step 1201. In step 1203, the interconnect is soldered to the busbar, e.g. to the solar cell metallization. In step 1204, another solar cell is shingled onto the solar cell so that liquid adhesive that will eventually become the flexible joint is in contact with the rear surface of the added solar cell. The interconnect may be soldered to the rear surface of the added solar cell. Steps 1203 and 1204 are interchangeable. The process may be repeated starting at step 1201 for another newly added solar cell until a string of solar cells of desired length is formed. After shingling the string of solar cells, the areas of liquid adhesive in the string of solar cells are then fully cured forming the flexible joints and interconnect reinforcements.

Figure 13:
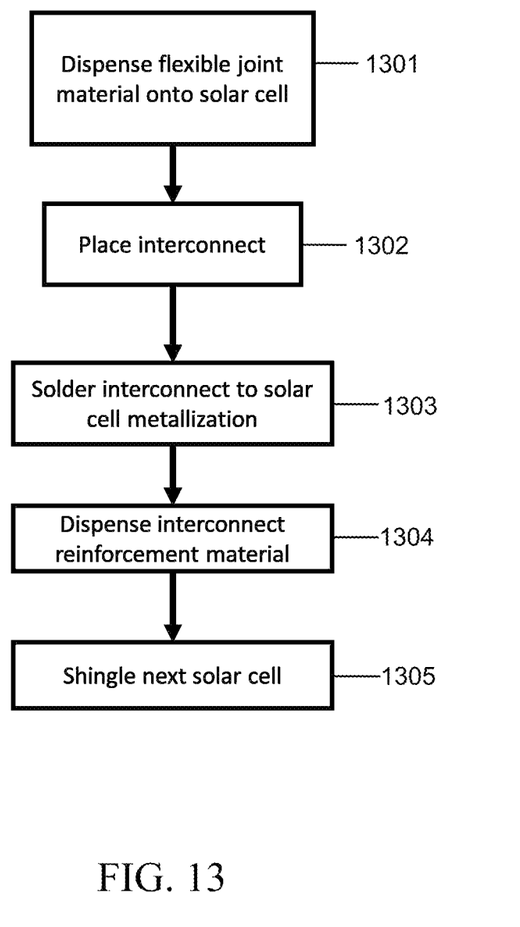

FIG. 13 is a flow chart showing alternative steps for assembling a string of shingled solar cells with flexible joints and interconnect reinforcements. In step 1301, liquid adhesive is dispensed or printed onto the front surface and at the edge of the solar cell. This area of liquid adhesive will eventually become the flexible joint. Optionally, after step 1301, the areas of liquid adhesive may be partially cured. In step 1302, the interconnect is placed into the liquid adhesive dispensed. In step 1303, the interconnect is soldered to the busbar. In step 1304, liquid adhesive is dispensed or printed onto the front surface of the solar cell at points along the interconnect. The liquid adhesive dispensed in step 1304 eventually becomes the interconnect reinforcements. In step 1305, another solar cell is shingled onto the solar cell. Steps 1303 and 1305 are interchangeable. The areas of liquid adhesive in the string of solar cells are then fully cured thereby forming the flexible joints and interconnect reinforcements.

Figure 14:
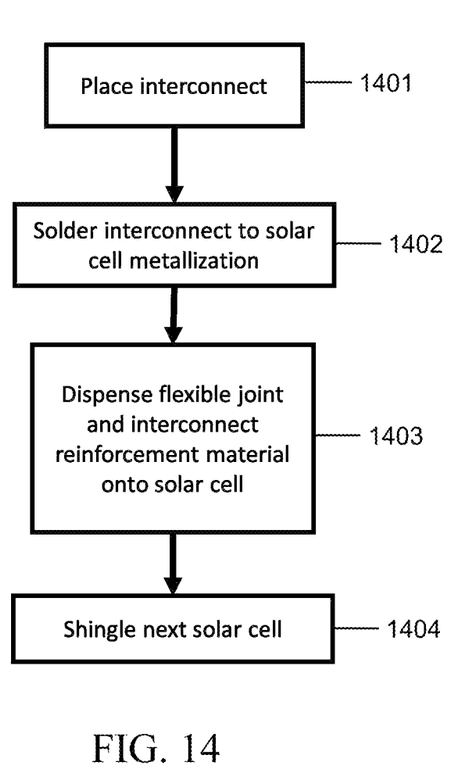

FIG. 14 is a flow chart showing alternative steps for assembling a string of shingled solar cells with flexible joints and interconnect reinforcements. In step 1401, the interconnect is placed onto the front surface of a solar cell. In step 1402, the interconnect is soldered to the busbar metallization. In step 1403, liquid adhesive is dispensed or printed onto the front surface of the solar cell and onto the interconnect at the appropriate positions along the interconnect to eventually form the flexible joint and the interconnect reinforcement. In step 1404, another solar cell is shingled onto the solar cell. The areas of liquid adhesive in the string of solar cells are then fully cured forming the flexible joints and interconnect reinforcements.

Figure 15:
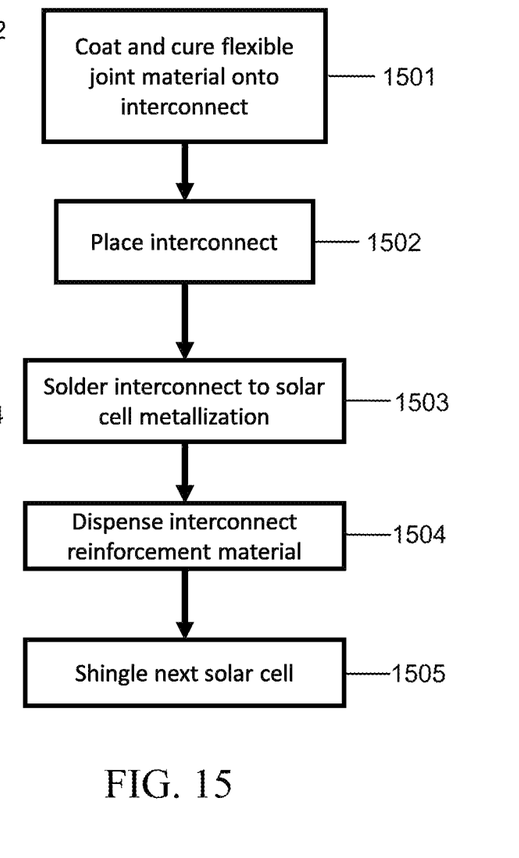

FIG. 15 is a flow chart showing alternative steps for assembling a string of shingled solar cells with flexible joints and interconnect reinforcements. In step 1501, liquid adhesive is coated onto the interconnect and then cured, thereby forming a flexible joint. In step 1502, the interconnect with the flexible joint is placed onto the front surface of a solar cell. In step 1503, the interconnect is soldered to the busbar metallization. In step 1504, liquid adhesive is dispensed or printed onto the front surface of the solar cell at points along the interconnect. The liquid adhesive dispensed in step 1504 eventually become the interconnect reinforcements. In step 1505, another solar cell is shingled onto the solar cell. Steps 1503 and 1505 are interchangeable. The areas of liquid adhesive in the string of solar cells are then fully cured forming the interconnect reinforcements.

While FIGS. 12-15 are flow charts showing steps for incorporating flexible joints and interconnect reinforcements into a string of solar cell, these flow process steps can be used to incorporate flexible joints without interconnect reinforcements by eliminating the steps concerning the interconnect reinforcements. Similarly, these flow process steps can be used to incorporate interconnect reinforcements without flexible joints by eliminating the steps concerning the flexible joint.

The amount of stress reduction on the solar cell when using a flexible joint was modeled using Finite Element Analysis. The simulation used a 4-point bending test of a module coupon containing two shingled cells. The simulation tested three situations: 1) shingled cells joined by electrically conductive adhesive (ECA); 2) shingled cells joined by a 0.22 mm circular wire; and 3) shingled cells joined by a 0.22 mm circular wire coated with a 0.1 mm thick flexible joint material. Table 1 shows the results of the simulation using a 42 Newton meter bending moment. When the solar cells are interconnected by ECA (case #1), the stress on the solar cell was the greatest. This stress is used as a reference of comparison with the other two cases. The results are given as a ratio of the maximum principal stress under bending divided by the maximum principal stress under bending for case #1. When a wire interconnect coated with flexible joint material is used, the stress on the solar cells was the lowest.

TABLE 1

| Cell interconnection | Max principal stress under bending/max principal stress under bending for ECA case |
|---|---|
| #1 - ECA | 1 |
| #2 - Wire only | 0.37 |
| #3 - Wire with flexible joint material | 0.32 |

The use of a flexible joint decreases solar cell cracking during solar cell module lamination. A solar cell module was constructed using 0.22 mm wire interconnects without adhesive material in the cell overlap area, e.g. as illustrated in FIG. 3B. After lamination, several cracks in the solar cell module appeared in areas where the wire interconnect passed through the cell overlap area. A different solar cell module was constructed using 0.22 mm wire interconnects and with 0.3 mm thick flexible joints in the cell overlap area, e.g. as illustrated in FIG. 6. After lamination of this solar cell module, no cracks appeared in the solar cells. The result was the same if the liquid adhesive was cured before shingling or was cured after shingling. These results are also the same using several material types for the flexible joint.

This disclosure is illustrative and not limiting. Further modifications will be apparent to one skilled in the art in light of this disclosure and are intended to fall within the scope of the appended claims. For example, where methods and steps described above indicate certain events occurring in certain order, those of ordinary skill in the art will recognize that the ordering of certain steps may be modified, and that some steps may be omitted or additional steps added, and that such modifications are in accordance with the variations of the invention.

What is claimed is:
1. A device comprising:
  a string of solar cells comprising
    at least a first and second substantially rectangular crystalline silicon solar cells arranged in a shingled manner, each solar cell comprising front and rear surfaces each having a metallization pattern;

a plurality of electrically conductive interconnects connecting the first and second solar cells electrically in series, each interconnect in contact with the rear surface metallization pattern of the first solar cell and in contact with the front surface metallization pattern of the second solar cell; and a plurality of flexible joints each comprising a cured liquid polymeric adhesive, each flexible joint in contact with the rear surface of the first solar cell, with the front surface of the second solar cell, and with only one of the plurality of electrically conductive interconnects, the cured liquid polymeric adhesive being electrically insulating and having a Shore A hardness of less than 80.

2. The device of claim 1, wherein the front surface metallization pattern of each solar cell comprises a plurality of busbars oriented parallel to a short side of the solar cell; and one of the plurality of electrically conductive interconnects is disposed on one of the busbars of the second solar cell.

3. The device of claim 2, wherein the one electrically conductive interconnect is soldered to the busbar of the second solar cell.

4. The device of claim 1, wherein one of the plurality of electrically conductive interconnects comprises a first portion with a flat rectangular cross-sectional area and second portion with a triangular cross-sectional area.

5. The device of claim 4, wherein the second portion of the electrically conductive interconnect is in contact with the front surface metallization pattern of the second solar cell.

6. The device of claim 1, comprising:
an interconnect reinforcement comprising a second cured liquid polymeric adhesive, the second cured liquid polymeric adhesive being electrically insulating, the interconnect reinforcement bonding one of the plurality of electrically conductive interconnects to the front surface of the second solar cell, the interconnect reinforcement covering only a portion of the front surface of the second solar cell, the interconnect reinforcement not covered by any adjacent solar cell.

7. The device of claim 6, wherein the second cured liquid polymeric adhesive is transparent.

8. The device of claim 6, wherein the interconnect reinforcement comprises an infrared reflective pigment.

9. The device of claim 6, wherein the interconnect reinforcement comprises an infrared transparent pigment.

10. The device of claim 6, wherein the second cured liquid polymeric adhesive is the same as the cured liquid polymeric adhesive of the flexible joints.

11. The device of claim 6, wherein the second cured liquid polymeric adhesive has a tensile adhesion strength between 0.1 and 20 MPa as measured by ASTM D897.

12. A device comprising:
a string of solar cells comprising
at least a first and second substantially rectangular crystalline silicon solar cells arranged in a shingled manner, each solar cell comprising front and rear surfaces each having a metallization pattern;
an electrically conductive interconnect connecting the first and second solar cells electrically in series, the interconnect in contact with the rear surface metallization pattern of the first solar cell and in contact with the front surface metallization pattern of the second solar cell; and
an interconnect reinforcement comprising a cured liquid polymeric adhesive, the cured liquid polymeric adhesive being electrically insulating, the interconnect reinforcement bonding the electrically conductive interconnect to the front surface of the second solar cell, the interconnect reinforcement covering only a portion of the front surface of the second solar cell, the interconnect reinforcement not covered by any solar cell.

13. The device of claim 12, wherein the cured liquid polymeric adhesive is transparent.

14. The device of claim 12, wherein the interconnect reinforcement comprises an infrared reflective pigment.

15. The device of claim 12, wherein the interconnect reinforcement comprises an infrared transparent pigment.

* * * * *